United States Patent
Oka et al.

(10) Patent No.: US 10,196,017 B2
(45) Date of Patent: Feb. 5, 2019

(54) WIRE HARNESS

(71) Applicant: Hitachi Metals, Ltd., Tokyo (JP)

(72) Inventors: Taichi Oka, Hitachi (JP); Takahiro Futatsumori, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/997,201

(22) Filed: Jun. 4, 2018

(65) Prior Publication Data
US 2018/0281707 A1 Oct. 4, 2018

Related U.S. Application Data

(63) Continuation of application No. 15/887,484, filed on Feb. 2, 2018, now Pat. No. 10,023,136, which is a continuation of application No. 15/432,247, filed on Feb. 14, 2017, now Pat. No. 9,947,435.

(30) Foreign Application Priority Data

Mar. 10, 2016 (JP) .................... 2016-046682
Sep. 2, 2016 (JP) .................... 2016-171471

(51) Int. Cl.
*H02G 3/04* (2006.01)
*H01B 7/00* (2006.01)
*B60R 16/02* (2006.01)
*H05K 9/00* (2006.01)

(52) U.S. Cl.
CPC ....... *B60R 16/0215* (2013.01); *H01B 7/0063* (2013.01); *H02G 3/0406* (2013.01); *H02G 3/0462* (2013.01); *H05K 9/0098* (2013.01)

(58) Field of Classification Search
CPC .......... H02G 3/0666; H02G 3/22; H02G 3/32; H02G 3/0406; H02G 15/04; H02G 3/00; H02G 3/04; H05K 9/0098; H05K 9/00; H01B 7/0045; B60R 16/0215; B60R 16/0207; H01F 17/06; H01F 27/266; H01F 2017/065; H01F 2017/066; H01F 27/66; H01R 13/6592; H01R 2201/26; H01R 13/5202; H01R 9/032; H01R 11/12
USPC ......... 174/72 A, 72 R, 74 R, 88 R, 70 C, 95, 174/68.1, 68.3; 138/111, 140, 141, 142; 285/238, 239, 242, 343
See application file for complete search history.

(56) References Cited

U.S. PATENT DOCUMENTS

| | | |
|---|---|---|
| 5,917,148 A | 6/1999 | Woehl |
| 8,895,875 B2 | 11/2014 | Kato |
| 9,345,179 B2 | 5/2016 | Imahori |

(Continued)

FOREIGN PATENT DOCUMENTS

JP  2014-130708 A  7/2014

*Primary Examiner* — Angel R Estrada
(74) *Attorney, Agent, or Firm* — Roberts Mlotkowski Safran Cole & Calderon P.C.

(57) ABSTRACT

A wire harness includes electric wires, and an electromagnetic wave suppression member that includes a restricting member and an annular magnetic core, the restricting member being provided to cover a periphery of the electric wires and including an inner wall portion more rigid than the electric wires, and the magnetic core being provided around the inner wall portion. The restricting member includes fixing portions formed to fix the electromagnetic wave suppression member to a fixing target.

21 Claims, 10 Drawing Sheets

(56) References Cited

U.S. PATENT DOCUMENTS

| | | |
|---|---|---|
| 9,390,837 B2 | 7/2016 | Toyama |
| 9,622,393 B2 | 4/2017 | Imahori |
| 9,661,792 B2 | 5/2017 | Wakabayashi |
| 9,693,491 B2 * | 6/2017 | Yanagihara .............. H05K 9/00 |
| 2014/0182921 A1 | 7/2014 | Imahori |

* cited by examiner

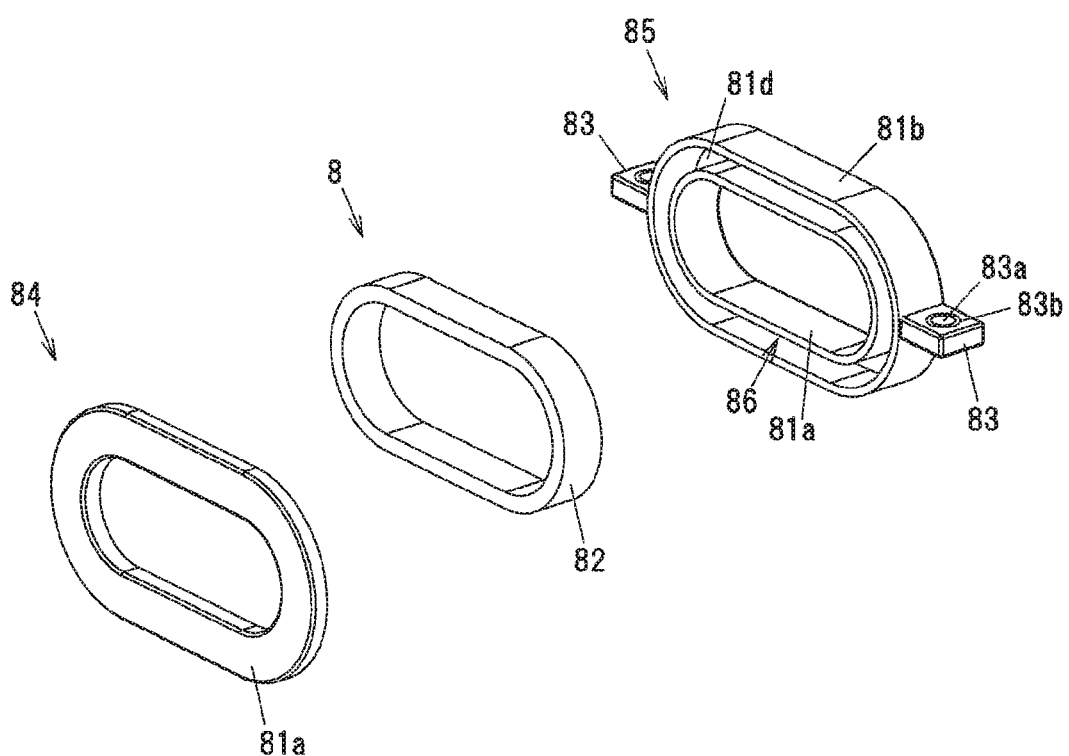

WIRE HARNESS

The present application is a Continuation Application under 35 USC § 120 of U.S. application Ser. No. 15/887,484, filed Feb. 2, 2018, which is a Continuation Application under 35 USC § 120 of US of application Ser. No. 15/432,247, filed Feb. 14, 2017, which is based on Japanese patent application Nos. 2016-046682 and 2016-171471 filed on Mar. 10, 2016 and Sep. 2, 2016, respectively, the entire contents of which are incorporated herein by reference.

BACKGROUND OF THE INVENTION

1. Field of the Invention

The invention relates to a wire harness.

2. Description of the Related Art

Wire harnesses are installed in, e.g., a vehicle having an electric motor as a drive source to connect an inverter to the electric motor. It is known that some of the wire harnesses are provided with a braided shield to reduce electromagnetic noise emitted from electric wires of the wire harness (see, e.g., JP-A-2014-130708).

JP-A-2014-130708 discloses a wire harness which is provided with a magnetic core as well as the braided shield so as to further remove the electromagnetic noise emitted from the wire harness.

SUMMARY OF THE INVENTION

In relation to JP-A-2014-130708, if the magnetic core is formed of a material (e.g., a nanocrystalline soft magnetic material) of which magnetic properties are likely to change when stress is applied thereto, a problem may arise that bent electric wires contact with the magnetic core upon routing the wire harness in a vehicle, so that the magnetic core changes in magnetic properties.

It is an object of the invention to provide a wire harness that, even if the magnetic core is formed of a material of which magnetic properties are likely to change when stress is applied, prevents a change in magnetic properties as well as reducing the electromagnetic noise.

According to an embodiment of the invention, a wire harness comprises:

electric wires; and an electromagnetic wave suppression member that comprises a restricting member and an annular magnetic core, the restricting member being provided to cover a periphery of the electric wires and comprising an inner wall portion more rigid than the electric wires, and the magnetic core being provided around the inner wall portion, wherein the restricting member comprises fixing portions formed to fix the electromagnetic wave suppression member to a fixing target.

Effects of the Invention

According to an embodiment of the invention, a wire harness can be provided that, even if the magnetic core is formed of a material of which magnetic properties are likely to change when stress is applied, prevents a change in magnetic properties as well as reducing the electromagnetic noise.

BRIEF DESCRIPTION OF THE DRAWINGS

Next, the present invention will be explained in more detail in conjunction with appended drawings, wherein:

FIG. 7 is an exploded perspective view showing the electromagnetic wave suppression member;

FIGS. 8A and 8B are diagrams illustrating a wire harness in a modification of the invention, wherein FIG. 8A is a perspective view and FIG. 8B is a cross sectional view;

FIGS. 9A and 9B are diagrams illustrating a wire harness in another modification of the invention, wherein FIG. 9A is a perspective view and FIG. 9B is a cutaway diagram.

DETAILED DESCRIPTION OF THE PREFERRED EMBODIMENTS

Embodiment

An embodiment of the invention will be described below in conjunction with the appended drawings.

Description of the General Structure of Wire Harness

Figure 1A:
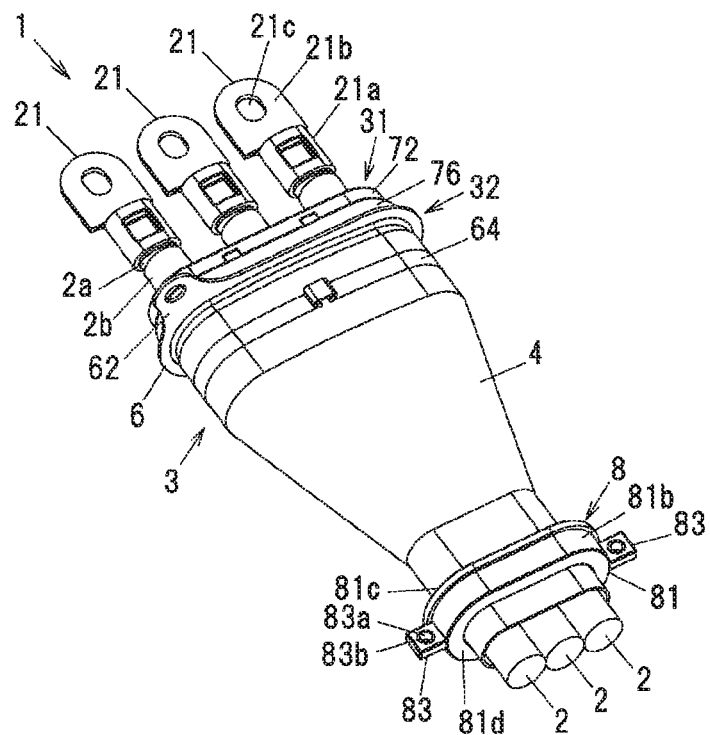
FIG. 1A is a perspective view showing an outer appearance of a wire harness in an embodiment of the present invention.
Figure 1B:
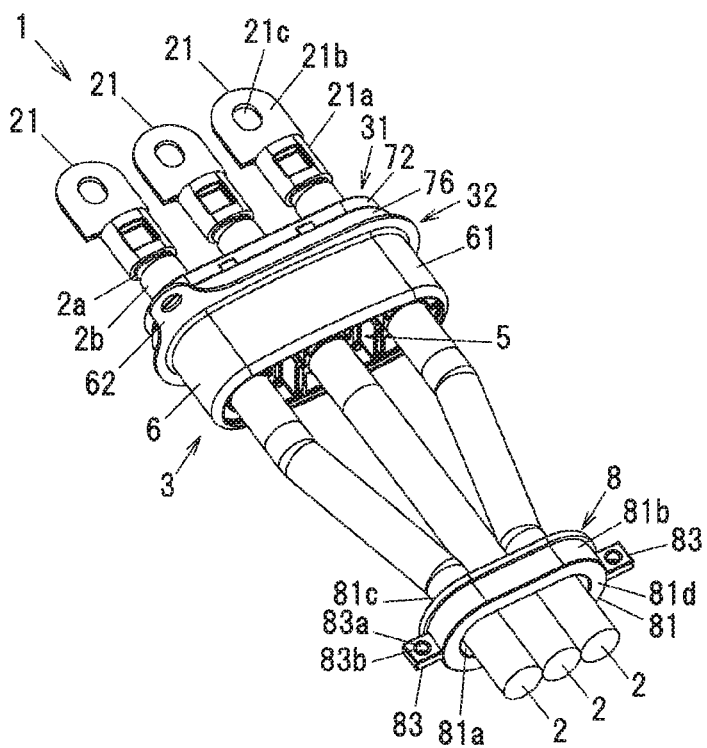
FIG. 1B is a perspective view which is the same as FIG. 1A but a braided shield is omitted.

FIG. 1A is a perspective view showing an outer appearance of a wire harness in the present embodiment and FIG. 1B is the same perspective view but a braided shield is omitted.

As shown in FIGS. 1A and 1B, a wire harness 1 is provided with electric wires 2 and a connector 3 attached at an end of the electric wires 2.

The wire harness 1 is installed in a vehicle such as electric car or hybrid car using an electric motor as a drive source, and is used such that an electric current output from an inverter under PMW (Pulse Width Modulation) control is supplied to the electric motor. The electric current contains harmonic components produced by switching a state of a switching element such as power transistor.

In the present embodiment, the wire harness 1 is configured to supply three-phase alternating current of U-phase, V-phase and W-phase through three electric wires 2 to the electric motor.

Each electric wire 2 is provided with a conductor 2a formed by twisting plural electrically high-conductive strands and an insulation 2b formed of an insulating resin and provided around the conductor 2a.

A connecting terminal 21 is connected to an end of each electric wire 2. The connecting terminal 21 integrally has a crimping portion 21a to be fixed to the conductor 2a by crimping, and a plate-shaped connecting portion 21b extending from the crimping portion 21a. A connecting hole 21c for bolt fixation is formed on the connecting portion 21b so as to penetrate the connecting portion 21b in a thickness direction. The connecting portion 21b is bolt-fixed to a corresponding device-side connecting terminal provided on a terminal block in a mounting member (e.g., an inverter) as a connection destination, and the connecting terminal 21 is thereby electrically connected to the device-side connecting terminal.

A braided shield 4 is provided around the three electric wires 2 such that all the three electric wires 2 are covered therein. The braided shield 4 is formed by braiding plural shield wires of, e.g., tin-plated copper. In this example, six shield wires are bundled into one strand and such strands are braided by crossing in an X-shaped manner, thereby forming the braided shield 4. The inner diameter of the braided shield 4 can be enlarged or shrunk by, e.g., manually changing a size of mesh.

In the present embodiment, an electromagnetic wave suppression member 8 is provided around the braided shield 4. The details of the electromagnetic wave suppression member 8 will be described later.

A corrugated tube for protecting the electric wires 2 may be provided around the braided shield 4 (at a portion on which the electromagnetic wave suppression member 8 is not provided) even though it is not illustrated. The corrugated tube is a tubular member formed of resin and has an accordion tube shape in which large diameter portions and small diameter portions are alternately formed.

Description of the Connector 3

Figure 2:
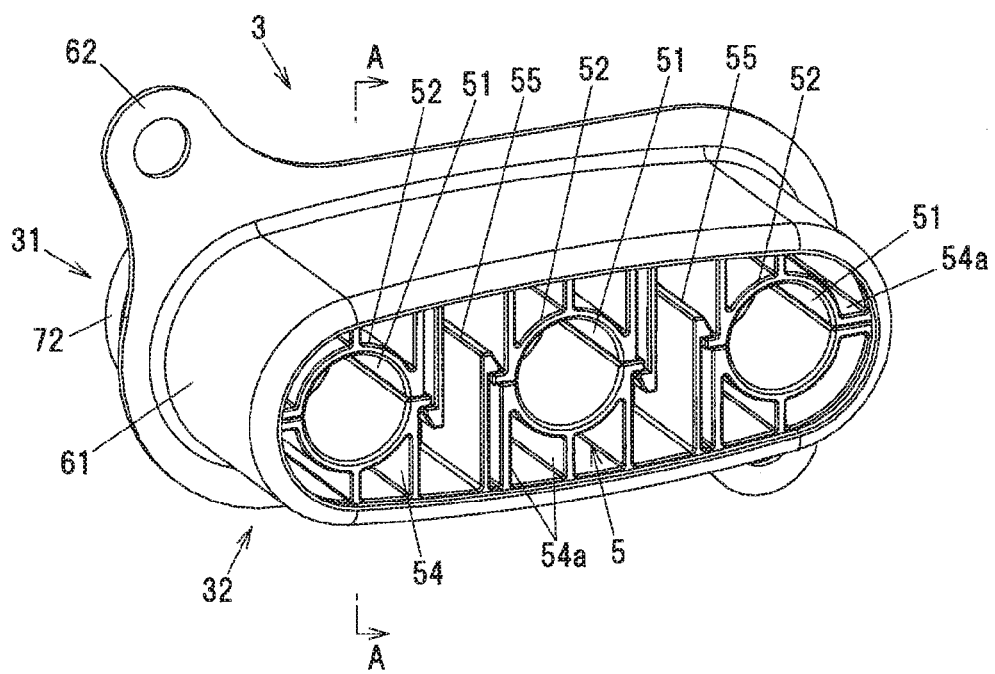
FIG. 2 is a perspective view showing a connector.
Figure 3:
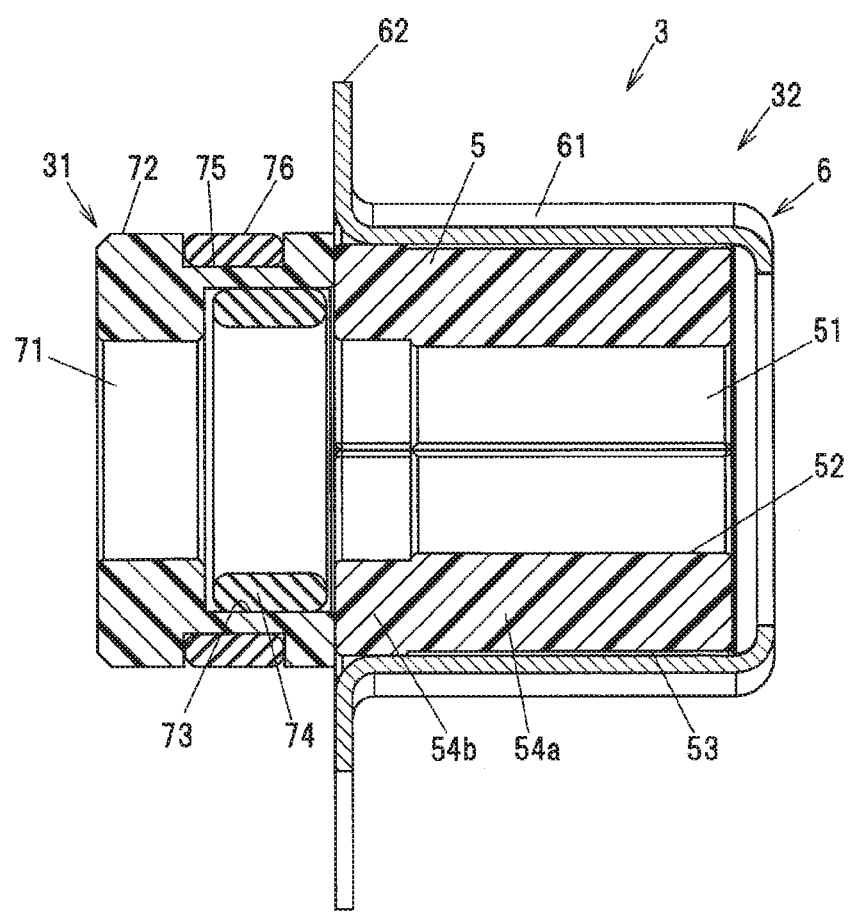
FIG. 3 is a cross sectional view taken along a line A-A in FIG. 2.
Figure 4:
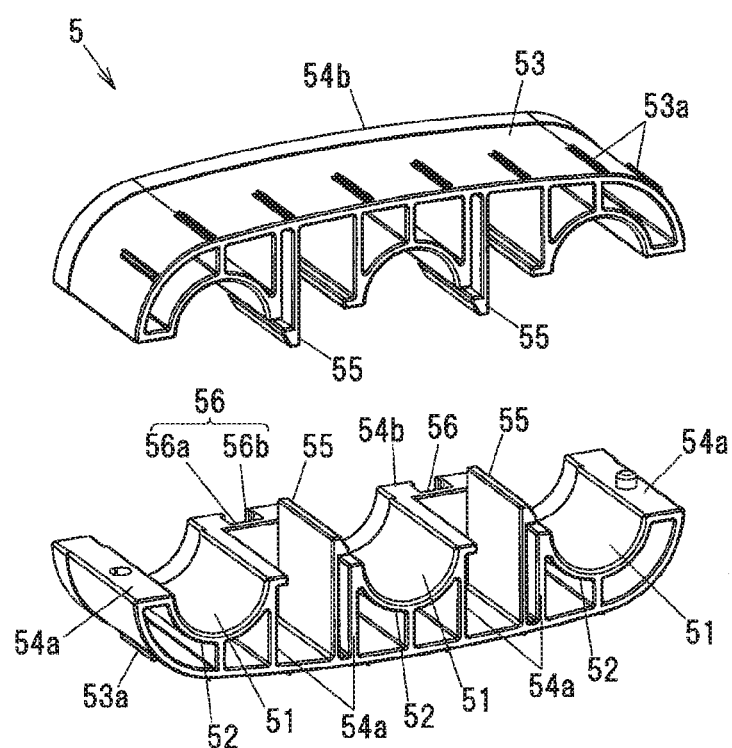
FIG. 4 is an exploded perspective view showing a housing.
Figure 5:
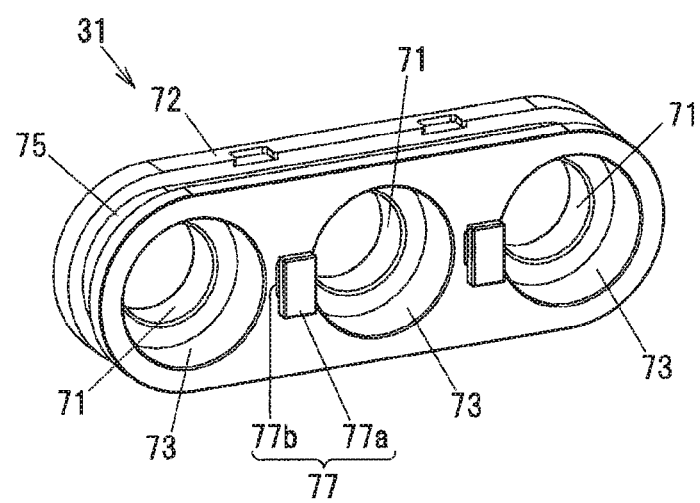
FIG. 5 is a perspective view showing a seal retainer.

FIG. 2 is a perspective view showing the connector 3 and FIG. 3 is a cross sectional view taken along a line A-A in FIG. 2. FIG. 4 is an exploded perspective view showing a housing 5 of the connector 3. FIG. 5 is a perspective view showing a seal retainer 72 of the connector 3.

As shown in FIGS. 2 and 3, the connector 3 is provided with a housed member 31 to be housed in an attachment hole (not shown) formed on the mounting member (e.g., an inverter), and a wire holding member 32 arranged next to the housed member 31 along the electric wires 2.

The wire holding member 32 holds the electric wires 2 and fixes the electric wires 2 to the mounting member (e.g., an inverter). The wire holding member 32 is provided with a housing (wire holder) 5 formed of an insulating resin and a shield shell (shield case) 6 formed of a conductive metal.

As shown in FIGS. 2 to 4, the housing 5 integrally has wire support portions 52 for supporting the electric wires 2, an outer wall portion 53 encircling and covering the wire support portions 52, and a coupling portion 54 coupling the wire support portions 52 to the outer wall portion 53. The housing 5 is formed by, e.g., injection molding of an insulation resin such as PBT (polybutylene terephthalate), PA (polyamide) or PPS (polyphenylene sulfide).

The wire support portion 52 has a cylindrical shape with an insertion hole 51 for insertion of the electric wire 2, and is configured to grip and hold the electric wire 2 inserted through the insertion hole 51. In this example, three wire support portions 52 are provided so as to correspond to the three electric wires 2. However, the configuration is not limited thereto. For example, the wire support portion may be one piece with three insertion holes 51. The three wire support portions 52 are aligned in a line at equal intervals in a direction perpendicular to the longitudinal direction of the electric wire 2 and are configured to hold the three aligned electric wires 2. In the following description of the connector 3, a direction parallel to the longitudinal direction of the electric wire 2 is referred to as a length direction, a direction parallel to the alignment direction of the electric wires 2 is referred to as a width direction, and a direction perpendicular to the length and width directions is referred to as a height direction.

The outer wall portion 53 has a cylindrical shape, and encircles and covers the wire support portions 52 at a distance from the wire support portions 52. The coupling portion 54 has rib-shaped coupling pieces 54a respectively coupling center portions in the width direction and both side portions of the wire support portions 52 to the outer wall portion 53, and a front wall portion 54b provided on the front side of the electric wire 2 to cover a gap between the wire support portions 52 and the outer wall portion 53.

The housing 5 in the present embodiment is split at the center in the height direction into upper and lower portions and the two halves of the housing 5 are fixed and integrated by a fixing means including lances 55.

The shield shell 6 is press-fitted onto the outer wall portion 53. The shield shell 6 is formed of, e.g., iron, brass or a conductive metal such as aluminum, and is configured to house at least a portion of the housing 5. Plural rib-shaped protrusions 53a extending along the length direction and arranged at intervals in a circumferential direction are formed on the outer surface of the outer wall portion 53 at an end portion on the wire insertion side, and the press-fitted shield shell 6 can be firmly fixed to the housing 5 by the protrusions 53a.

The shield shell 6 has a cylindrical portion 61 and a flange portion 62. The cylindrical portion 61 is provided to cover the periphery of the outer wall portion 53 of the housing 5. The flange portion 62 protrudes outward from an end portion of the cylindrical portion 61 on the front side and is provided as a fixing portion to be fixed to a casing of the mounting member (e.g., an inverter). A belt-shaped fastening member 64 is provided around the shield shell 6. By using the fastening member 64, the braided shield 4 is fixed to the outer surface of the shield shell 6 and the cylindrical portion 61 is tightened and fixed to the housing 5.

As shown in FIGS. 3 and 5, the housed member 31 is a member to be housed in an attachment hole (not shown) formed on the mounting member (e.g., an inverter), and is arranged on the front side relative to the flange portion 62 of the shield shell 6.

The housed member 31 is provided with the seal retainer 72 having three insertion holes 71 for insertion of the electric wires 2, an outer seal member 76 fitted onto the outer peripheral surface of the seal retainer 72 to seal between the inner surface of the attachment hole of the mounting member (e.g., an inverter) and the seal retainer 72, and inner seal members (wire seals) 74 fitted onto the inner surfaces of the insertion holes 71 to seal between the insertion holes 71 and the electric wires 2. In FIG. 5 illustrations of the outer seal member 76 and the inner seal members 74 are omitted.

The seal retainer 72 is formed of an insulating resin, e.g., PBT (polybutylene terephthalate), PA (polyamide) or PPS (polyphenylene sulfide), etc.

The outer seal member 76 has an annular shape and is arranged in an outer seal member-receiving groove 75 formed along a circumferential direction on the outer surface of the seal retainer 72. The outer seal member 76 is interposed between the seal retainer 72 and the inner surface of the attachment hole of the mounting member (e.g., an inverter) and prevents water from entering the mounting member (e.g., an inverter) from the outside of the seal retainer 72.

Each inner seal member 74 has an annular shape and is arranged in an inner seal member-receiving groove 73 formed in the insertion hole 71 along the circumferential direction at an end portion of the seal retainer 72 on the housing 5 side. The inner seal member 74 is interposed between the insulation 2b of the electric wire 2 and the seal retainer 72 and prevents water from running along the electric wire 2 and into the mounting member (e.g., an inverter).

Locking protrusions 77 are integrally formed on a base end portion of the seal retainer 72 and protrude from the base end. Each locking protrusion 77 integrally has a rectangular parallelepiped-shaped head 77a and a rectangular parallelepiped-shaped (rectangular column-shaped) stem (neck) 77b which couples the head 77a to the seal retainer 72 and has smaller width and height than the head 77a.

Locking grooves 56 to be engaged with the locking protrusions 77 are formed on the front wall portion 54b of the housing 5. The locking groove 56 has a head housing portion 56a having larger width, height and length than the head 77a of the locking protrusion 77 and provided to house the head 77a, and a stem housing portion 56b having smaller width and height than the head 77a and larger width and height and a shorter length than the stem 77b, and is formed such that the head housing portion 56a opens toward the front via the stem housing portion 56b.

In the configuration in which the locking protrusions 77 are engaged with the locking grooves 56 by housing the heads 77a in the head housing portions 56a and the stems 77b in the stem housing portions 56b, the seal retainer 72 can move relative to the wire holding member 32 when fixing the shield shell 6 to a casing of the mounting member (e.g., an inverter). In the present embodiment, the seal retainer 72 can move relative to the housing 5 in the length, width and height directions.

In such a configuration, even when the wire holding member 32 (the shield shell 6 or the housing 5) is rotated or tilted due to torque applied by bending of the electric wire 2 or bolt fixation of the shield shell 6, the seal retainer 72 is less likely to move along with the rotation or tilt and it is thus possible to prevent loss of waterproof function caused by, e.g., excessive compression of only a portion of the outer seal member 76.

Although the head 77a and the stem 77b of the locking protrusion 77 have a rectangular parallelepiped shape (or a rectangular column shape) in this example, the shapes of the head 77a and the stem 77b are not limited thereto. For example, the head 77a and the stem 77b may have a circular column shape or the head 77a may have a spherical shape.

In addition, a means for relatively movably coupling the seal retainer 72 to the wire holding member 32 (the housing 5) is not limited to a combination of the locking protrusions 77 and the locking grooves 56. For example, hooks (lances) having elasticity and extending from one of the seal retainer 72 and the housing 5 may be used in combination with locking portions provided on the other of the seal retainer 72 and the housing 5 to engage the hooks, so that elasticity of the hooks allows the seal retainer 72 and the wire holding member 32 (the housing 5) to relatively move even in a state in which the seal retainer 72 is coupled to the housing 5 by engagement between the hooks and the locking protrusions.

Description of the Electromagnetic Wave Suppression Member 8

Figure 6A:
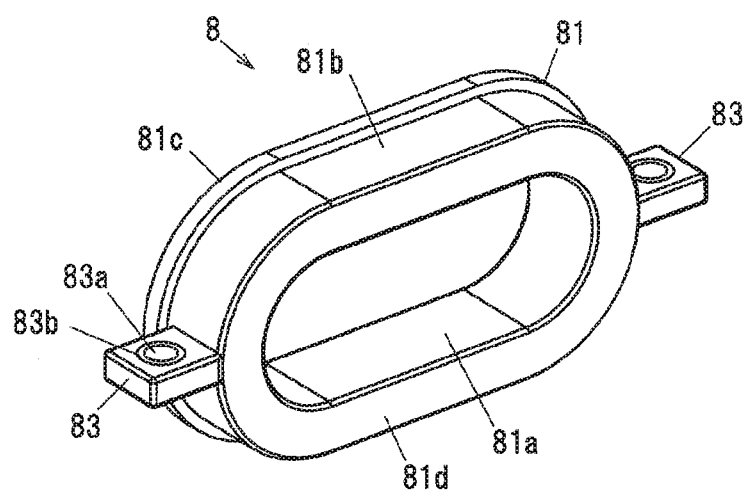
FIG. 6A is a perspective view showing an electromagnetic wave suppression member.
Figure 6B:
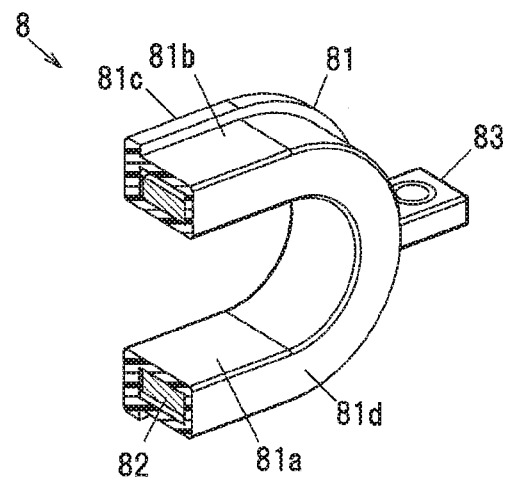
FIG. 6B is a cutaway diagram illustrating the electromagnetic wave suppression member.

FIG. 6A is a perspective view showing the electromagnetic wave suppression member 8 and FIG. 6B is a cutaway diagram thereof.

As shown in FIGS. 1 and 6, the electromagnetic wave suppression member 8 is provided with a restricting member 81 and an annular magnetic core 82. The restricting member 81 is provided to cover the periphery of the electric wires 2 and has an inner wall portion 81a which is more rigid than the electric wires 2. The magnetic core 82 is formed of a nanocrystalline soft magnetic material and is provided circumferentially around the inner wall portion 81a. The term "rigid" here means that it is more inflexible than others when objects of the same length (unit length) are held at both ends and bent.

In the present embodiment, the magnetic core 82 is formed of a nanocrystalline soft magnetic material. The nanocrystalline soft magnetic material is a material which is obtained by crystallizing an amorphous alloy such that nanocrystalline grains in the ferromagnetic phase are dispersed in the remaining amorphous phase. It is also possible to use a soft magnetic material such as soft ferrite to form the magnetic core 82.

In this example, Finemet (registered trademark) is used as the nanocrystalline soft magnetic material. The magnetic core 82 formed of Finemet (registered trademark) is formed as follow: for example, an alloy melt containing Fe(—Si)—B as a basic component and a trace amount of Cu and an element such as Nb, Ta, Mo or Zr is firstly processed into an amorphous metal ribbon having a thickness of about 20 µm by a rapid quenching method such as single-roll technique, and the ribbon is formed into a magnetic core shape (in this example, an annular shape covering all of the three electric wires 2) and is then crystallized by heat treatment at not less than crystallization temperature. The grain size of crystal in the magnetic core 82 is about 10 nm. Alternatively, the magnetic core 82 may be formed of another nanocrystalline soft magnetic material other than Finemet (registered trademark) and, for example, NANOMET (registered trademark) may be used.

The nanocrystalline soft magnetic material has a higher saturation magnetic flux density and better soft magnetic properties (higher magnetic permeability, lower core loss characteristics) than conventionally used soft magnetic materials such as soft ferrite. Therefore, it is possible to downsize the magnetic core 82 by using the nanocrystalline soft magnetic material as the magnetic core 82. As a result, it is possible to prevent an increase in size and mass of the electromagnetic wave suppression member 8 and the entire wire harness 1 can remain compact and light in weight even after attaching the electromagnetic wave suppression member 8. By taking into consideration the properties of the nanocrystalline soft magnetic material to be used, the size (thickness and length) of the magnetic core 82 is appropriately adjusted such that desired characteristics are obtained.

As compared to the conventionally used soft magnetic materials such as soft ferrite, the nanocrystalline soft magnetic material also has such properties that it can suppress electromagnetic noise in a frequency band used for radio such as AM radio. In vehicles, traffic information, etc., is provided through AM radio. Therefore, the wire harness 1 especially when used in a vehicle has a profound effect on suppressing electromagnetic noise in a frequency band used for radio.

The nanocrystalline soft magnetic material, however, has properties that magnetic properties are likely to change when external stress is applied. Therefore, when using the magnetic core 82 formed of the nanocrystalline soft magnetic material, it should be designed such that external stress is not applied to the magnetic core 82.

Based on this, in the present embodiment, the electromagnetic wave suppression member 8 is configured such that the annular magnetic core 82 formed of the nanocrystalline soft magnetic material is provided around the inner wall portion 81a which is more rigid than the electric wire 2. In this configuration, stress is not applied to the magnetic core 82 when, e.g., the electric wires 2 are bent, and it is thus possible to prevent a change in magnetic properties of the magnetic core 82. In sum, the restricting member 81 (the inner wall portion 81a) prevents contact of the electric wires 2 with the magnetic core 82 by restricting movement of the electric wires 2 when the electric wires 2 are bent, thereby protecting the magnetic core 82.

Although the entire restricting member 81 is formed of a material more rigid than the electric wire 2 in the present embodiment, it is not limited thereto as long as at least the inner wall portion 81a is formed of a material more rigid than the electric wire 2. The restricting member 81 may be formed of an insulating resin, e.g., PBT (polybutylene terephthalate), PA (polyamide) or PPS (polyphenylene sulfide), etc.

If the magnetic core 82 protrudes beyond the inner wall portion 81a in the length direction (in the longitudinal direction of the electric wire 2), the protruding portion of the magnetic core 82 may come into contact with the bent electric wires 2, causing a change in magnetic properties of the magnetic core 82. Therefore, the magnetic core 82 is desirably provided so as not to protrude beyond the inner wall portion 81a in the longitudinal direction of the electric wire 2.

When the inner wall portion 81a is thick, there is no risk of contact between the electric wires 2 and the magnetic core 82 even when the magnetic core 82 slightly protrudes beyond the inner wall portion 81a in the length direction (in the longitudinal direction of the electric wire 2) since a distance between the magnetic core 82 and the electric wires 2 is increased. However, the larger the distance between the electric wires 2 and the magnetic core 82, the longer the circumferential length of the magnetic core 82 laminated on the inner wall portion 81a and the less effective the electromagnetic wave suppression is. That is, by providing the magnetic core 82 so as not to protrude beyond the inner wall portion 81a in the longitudinal direction of the electric wire 2 as in the present embodiment, it is possible to prevent a change in magnetic properties of the magnetic core 82 while reducing the thickness of the inner wall portion 81a (reducing the distance between the magnetic core 82 and the electric wires 2) to suppress electromagnetic wave more effectively.

In the present embodiment, the restricting member 81 is further provided with a cylindrical outer wall portion 81b, a front wall portion 81c and a rear wall portion 81d. The outer wall portion 81b is provided to cover the inner wall portion 81a and the magnetic core 82 such that the magnetic core 82 is sandwiched between the inner wall portion 81a and the outer wall portion 81b. The front wall portion 81c and the rear wall portion 81d are provided as a restricting portion which prevents the magnetic core 82 from falling through between the inner wall portion 81a and the outer wall portion 81b.

The outer wall portion 81b is formed to cover the outer surface of the magnetic core 82 and serves to prevent a change in magnetic properties of the magnetic core 82 caused by contact of surrounding members (vehicle body, etc.) with the magnetic core 82.

The front wall portion 81c couples an end portion of the inner wall portion 81a to an end portion of the outer wall portion 81b on the connector 3 side and covers a gap between the inner wall portion 81a and the outer wall portion 81b. The rear wall portion 81d couples another end portion of the inner wall portion 81a to another end portion of the outer wall portion 81b on the opposite side to the connector 3 and covers a gap between the inner wall portion 81a and the outer wall portion 81b. In other words, the restricting member 81 is annular as the entire shape and has a rectangular cross section when taken in a direction perpendicular to the circumferential direction thereof.

In the present embodiment, the inner wall portion 81a has a cylindrical shape covering the three electric wires 2 and the braided shield 4, and is configured such that the three electric wires 2 in the aligned state are held therein. In other words, the inner wall portion 81a holds the three electric wires 2. In detail, the inner wall portion 81a is in contact with the braided shield 4 and holds the three electric wires 2 via the braided shield 4. In the present embodiment, the restricting member 81 also has fixing portions 83 formed to fix the electromagnetic wave suppression member 8 to a vehicle body, etc. In detail, the fixing portions 83 for fixing the electromagnetic wave suppression member 8 to a fixing target such as vehicle body are formed on the outer wall portion 81b respectively at both ends in the alignment direction of the electric wires 2 (in the major axis direction of the outer wall portion 81b) and protrude outward in the alignment direction of the electric wires 2 (in the major axis direction of the outer wall portion 81b). A bolt hole 83a for insertion of a bolt used for bolt fixation is formed on each fixing portion 83 and a hollow-cylindrical metal collar 83b is provided at a rim of the bolt hole 83a to prevent deformation of the restricting member 81 at the time of tightening the bolt. The fixing target is not limited to the vehicle body and may be, e.g., a casing of a motor device or a casing of an inverter device. Since the fixing portions 83 for fixing the electromagnetic wave suppression member 8 to a fixing target such as vehicle body are formed on the restricting member 81, it is possible to eliminate other separately-provided fixing members and it is thus effective to reduce the number of components. As such, in the present embodiment, the restricting member 81 serves as a housing portion for housing the magnetic core 82 and also serves as a movement-restricting portion for restricting the electromagnetic wave suppression member 8 from moving along the longitudinal direction of the electric wire 2.

In the present embodiment, the inner wall portion 81a is formed to cover all of the three electric wires 2 and the magnetic core 82 is provided around the inner wall portion 81a so as to cover all of the three electric wires 2. However, it is not limited thereto and the configuration may be such that the inner wall portions are formed to separately cover the electric wires 2 and the magnetic cores 82 are provided to separately cover the electric wires 2. In this regard, however, the intervals between the electric wires 2 (the intervals between the inner walls separately provided around the electric wires 2) need to be increased to the extent that the magnetic cores 82 can be housed therebetween, which may cause an increase in size of the electromagnetic wave suppression member 8. That is, the configuration in which the magnetic core 82 covers all of plural electric wires 2 contributes to downsizing of the electromagnetic wave suppression member 8.

When desired to fix the electromagnetic wave suppression member 8 to the electric wires 2 more firmly at a predetermined position in the longitudinal direction of the electric wire 2, for example, the electromagnetic wave suppression member 8 may be fixed to the electric wires 2 by winding an additionally-provided adhesive tape, or a clip member gripping and holding the electric wires 2 may be provided on the electric wires 2 such that movement of the electromagnetic wave suppression member 8 along the longitudinal direction of the electric wire 2 is restricted by contact with the clip member.

Although the electromagnetic wave suppression member 8 is provided around the braided shield 4 in the present embodiment, it is not limited thereto. The electromagnetic wave suppression member 8 may be provided on the inner side of the braided shield 4, i.e., between the electric wires 2 and the braided shield 4. In this case, since it is difficult to fix the electromagnetic wave suppression member 8 to a vehicle body, etc., by bolt fixation using the fixing portions 83, a special fixing member is provided without providing the fixing portions 83 such that the braided shield 4 and the electromagnetic wave suppression member 8 are firmly held and fixed together to a vehicle body, etc., by the special fixing member. By providing the electromagnetic wave suppression member 8 around the braided shield 4 as in the present embodiment, the need for separate fixing members is eliminated and it is thus possible to reduce the number of components.

The restricting member 81 may have a split configuration, as shown in FIG. 7. In this example, the electromagnetic wave suppression member 8 is provided with a first member 84 constructed from the front wall portion 81c and a second member 85 composed of the inner wall portion 81a, the outer wall portion 81b and the rear wall portion 81d. After the magnetic core 82 is housed in a space 86 surrounded by the inner wall portion 81a, the outer wall portion 81b and the rear wall portion 81d of the second member 85, the first member 84 and the second member 85 are fixed and integrated, and the electromagnetic wave suppression member 8 is thereby formed. The method of fixing the first member 84 to the second member 85 is not specifically limited. For example, the first member 84 and the second member 85 can be fixed and integrated by, e.g., adhesive fixation by an adhesive or mechanical fixation by locking mechanism using lances, etc.

Functions and Effects of the Embodiment

As described above, the wire harness 1 in the present embodiment has the electromagnetic wave suppression member 8 around the electric wires 2, and the electromagnetic wave suppression member 8 is provided with the restricting member 81 covering the electric wires 2 and having the inner wall portion 81a more rigid than the electric wires 2, and the annular magnetic core 82 provided around the inner wall portion 81a. In addition, the magnetic core 82 is formed of a nanocrystalline soft magnetic material.

Since the magnetic core 82 is formed of a nanocrystalline soft magnetic material, the magnetic core 82 can have a smaller size than conventionally-used ferrite core, etc., and it is thereby possible to realize a small and light electromagnetic wave suppression member 8. Downsizing of the electromagnetic wave suppression member 8 facilitates routing of the wire harness 1 even in a narrow space and this improves the degree of freedom of the layout of routing the wire harness 1. In addition, since the electromagnetic wave suppression member 8 is light in weight, an increase in mass of the wire harness 1 after attaching the electromagnetic wave suppression member 8 is reduced and it is thereby possible to improve handling properties of the wire harness 1.

Meanwhile, the nanocrystalline soft magnetic material is a material of which magnetic properties are likely to change when stress is applied. However, since the magnetic core 82 is provided around the inner wall portion 81a which is more rigid than the electric wire 2, load is not applied to the magnetic core 82 even when, e.g., the electric wires 2 are bent or vibrated, and it is thus possible to prevent a change in magnetic properties of the magnetic core 82.

Modifications

Although the inner wall portion 81a in the embodiment describe above is configured to hold three electric wires 2, the inner wall portion 81a may not be configured to hold three electric wires 2. That is, a clearance may be provided between the inner wall portion 81a and the braided shield 4.

Figure 8A:
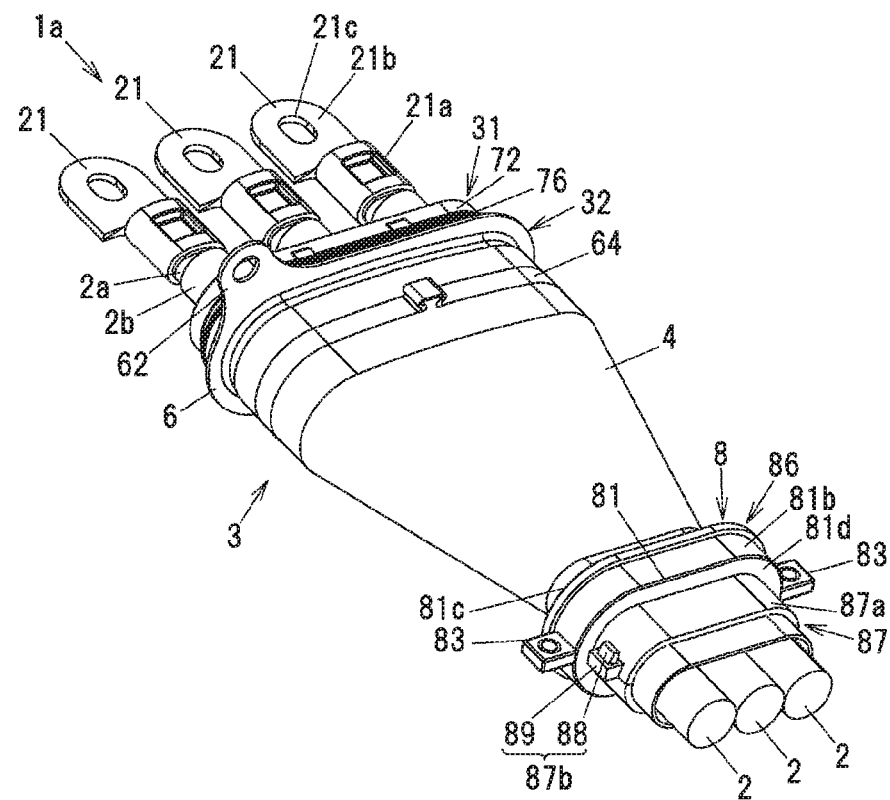
Figure 8B:
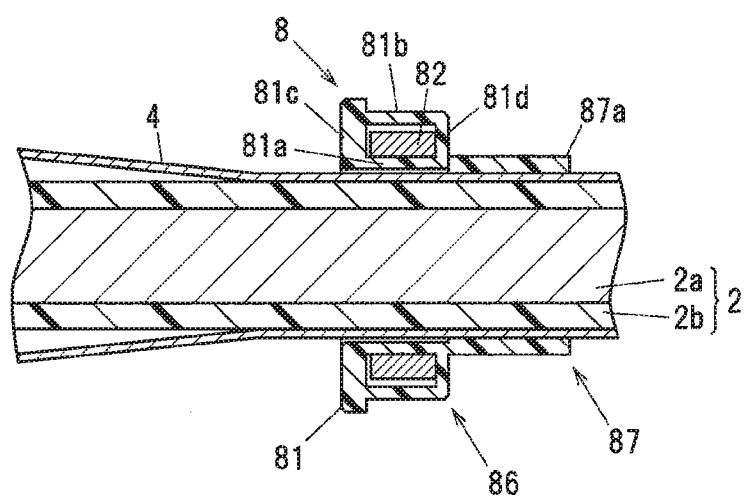

In this case, as is a wire harness 1a shown in FIGS. 8A and 8B, a housing portion 86 for housing the magnetic core 82 and a movement-restricting portion 87 fixed to the electric wires 2 (via the braided shield 4) to prevent movement of the restricting member 81 along the longitudinal direction of the electric wires 2 may be aligned in a line along the longitudinal direction of the electric wire 2. In other words, the housing portion 86 and the movement-restricting portion 87 may be formed at different positions in the longitudinal direction and integrated into the restricting member 81.

The housing portion 86 is substantially the same as the restricting member 81 shown in FIG. 6 and has an annular shape having the inner wall portion 81a, the outer wall portion 81b, the front wall portion 81c and the rear wall portion 81d. However, in the wire harness 1a, there is a gap between the inner wall portion 81a and the electric wires 2. The presence of the gap between the inner wall portion 81a and the electric wires 2 facilitates work of inserting the electric wires 2 and the braided shield 4 through the inner wall portion 81a, and it is thus easy to attach the electromagnetic wave suppression member 8.

The movement-restricting portion 87 fixes the restricting member 81 (the electromagnetic wave suppression member 8) to the electric wires 2 by griping and holding the three electric wires 2 via the braided shield 4 such that the restricting member 81 (the electromagnetic wave suppression member 8) does not move along the longitudinal direction of the electric wire 2.

The movement-restricting portion 87 has a cylindrical portion 87a having a cylindrical shape covering all the three electric wires 2 (and the braided shield 4), and a fixing means 87b for fixing the cylindrical portion 87a in the form of gripping and holding the three electric wires 2 (and the braided shield 4).

The cylindrical portion 87a has a rounded rectangular shape (a shape composed of two same length parallel lines and two semicircular arcs connecting between ends of the parallel lines) in a cross section perpendicular to the axial direction. The inner surface of the cylindrical portion 87a is in contact with the braided shield 4. The cylindrical portion 87a is preferably more rigid than the electric wire 2, in the same manner as the inner wall portion 81a.

The cylindrical portion 87a of the wire harness 1a is coupled to the housing portion 86 (to the rear wall portion 81d in this example) only at a portion in the circumferential direction (e.g., only at one of the parallel portions). In addition, the cylindrical portion 87a is cut at one position in the circumferential direction (in this example, at one of end portions in the alignment direction of the electric wires 2 (in the major axis direction) or at the center of one of the semicircular arcs), and is configured to be openable at the cut portion.

Meanwhile, the fixing means 87b of the wire harness 1a couples two circumferential ends (ends facing each other with the cut portion in between) of the cylindrical portion 87a and thereby fixes the cylindrical portion 87a in the form of gripping and holding the three electric wires 2 (and the braided shield 4). The fixing means 87b here is composed of a lance 88 and a locking hole 89 to be engaged with the lance 88.

After the electric wires 2 and the braided shield 4 are inserted through the housing portion 86 in the state in which the cylindrical portion 87a is open, the lance 88 is engaged in the locking hole 89 such that the cylindrical portion 87a tightens around the electric wires 2 and the braided shield 4, thereby fixing the restricting member 81 to the electric wires 2.

The fixing means 87*b* only needs to be capable of fixing the cylindrical portion 87*a* in the form of gripping and holding the three electric wires 2 (and the braided shield 4), and may be, e.g., a tightening band which is wound around and tightens around the cylindrical portion 87*a* such that the cylindrical portion 87*a* grips and holds the three electric wires 2 (and the braided shield 4).

As described above, since the movement-restricting portion 87 of the wire harness 1*a* is composed of the cylindrical portion 87*a* openable at the cut portion and the fixing means 87*b*, the three electric wires 2 (and the braided shield 4) can be inserted through the cylindrical portion 87*a* opened at the cut portion and then can be gripped and held by the cylindrical portion 87*a*. Thus, efficiency of work for attaching the electromagnetic wave suppression member 8 can be improved since it is easy to insert the three electric wires 2 (and the braided shield 4) through the restricting member 81, and it is also possible to firmly fix the restricting member 81 to the electric wires 2.

Although FIG. 8 shows an example in which a clearance is present between the inner wall portion 81*a* and the braided shield 4, the clearance between the inner wall portion 81*a* and the braided shield 4 in FIG. 8 may be eliminated (or reduced in size) such that the inner wall portion 81*a* (housing portion) serves to hold the electric wires 2. In this case, however, it is difficult to insert the electric wires 2 or the braided shield 4 through the housing portion 86. Therefore, providing a clearance between the inner wall portion 81*a* and the braided shield 4 is more desirable.

As a means of integrating the housing portion 86 with the movement-restricting portion 87, it is possible to use adhesion of the housing portion 86 to the movement-restricting portion 87 using an adhesive, etc., mechanical fixation by screw or locking mechanism, etc., or integral molding in which the movement-restricting portion 87 is molded together with the housing portion 86 using the same resin. In this example, the housing portion 86 and the movement-restricting portion 87 are integrally molded by injection molding.

Figure 9A:
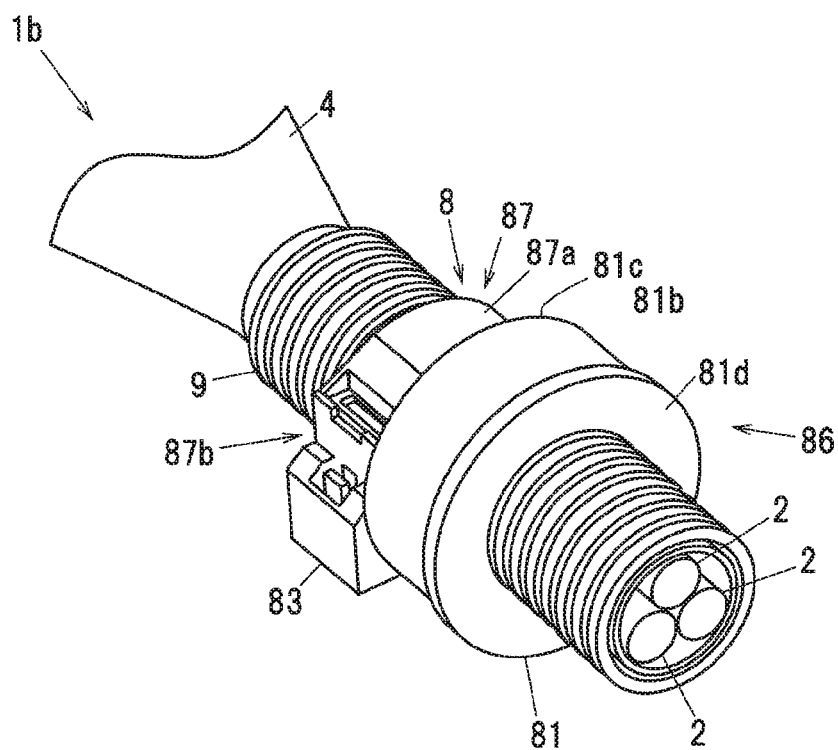
Figure 9B:
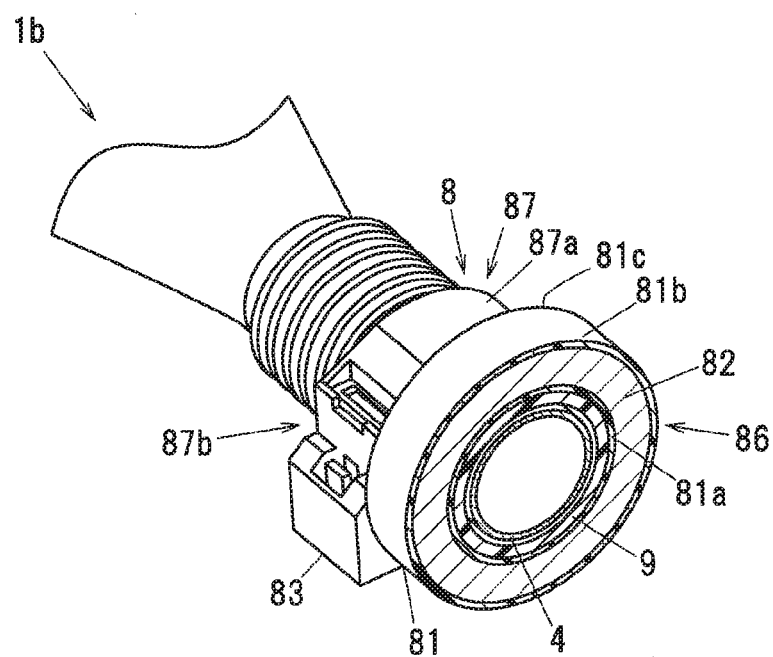

In addition, although the movement-restricting portion 87 is fixed to the electric wires 2 via the braided shield 4 in the wire harness 1*a* shown in FIG. 8, the movement-restricting portion 87 may be fixed to a member covering the electric wires 2 as in a wire harness 1*b* shown in FIGS. 9A and 9B.

The wire harness 1*b* shown in FIGS. 9A and 9B is configured such that three bundled electric wires 2 extending from the connector 3 (the electric wires 2 bundled such that a line connecting the center axes of the electric wires 2 forms a triangular shape (equilateral triangle) in a cross section perpendicular to the longitudinal direction of the electric wire 2) are covered with the braided shield 4 which is in turn covered with a corrugated tube 9 as a resin round tubular member having an accordion tube shape. In the wire harness 1*b*, the movement-restricting portion 87 is fixed to the corrugated tube 9.

The housing portion 86 and the movement-restricting portion 87 are formed along the outer circumference of the corrugated tube 9. Since the corrugated tube 9 used here has a circular shape in the cross section perpendicular to the longitudinal direction, the housing portion 86 and the movement-restricting portion 87 have a substantially circular annular shape.

In the modification shown in FIGS. 9A and 9B, the electromagnetic wave suppression member 8 is also provided with the restricting member 81 and the magnetic core 82, and the restricting member 81 has the inner wall portion 81*a* more rigid than the electric wire 2, the cylindrical outer wall portion 81*b* covering the magnetic core 82, and the front wall portion 81*c* and the rear wall portion 81*d* which restrict movement of the magnetic core 82 and thereby prevent the magnetic core 82 from falling off. In addition, the inner wall portion 81*a* is more rigid than the corrugated tube 9 and is thus more inflexible than the corrugated tube 9. Therefore, even when the plural electric wires 2 are bent together with the corrugated tube 9, stress due to the bending is less likely to be generated in the magnetic core 82.

While the movement-restricting portion 87 of the wire harness 1*a* shown in FIGS. 8A and 8B is provided next to the housing portion 86 on the opposite side to the connector 3, the movement-restricting portion 87 of the wire harness 1*b* shown in FIGS. 9A and 9B is provided next to the housing portion 86 on the connector 3 side.

In addition, while the fixing portions 83 for fixing the electromagnetic wave suppression member 8 to a fixing target, e.g., a vehicle body or an on-vehicle device such as motor, are integrally formed with the housing portion 86 in FIGS. 8A and 8B, the fixing portion 83 of the wire harness 1*b* shown in FIGS. 9A and 9B is integrally formed with the movement-restricting portion 87. A block-shaped fixing portion 83 protruding radially outward from the cylindrical portion 87*a* is formed on the wire harness 1*b*. For example, a threaded hole for mating with a fixing bolt is formed on the fixing portions 83 which thereby can be bolt-fixed to a fixing target such as vehicle body. Alternatively, the fixing portions 83 may be provided on both the housing portion 86 and the movement-restricting portion 87, or a fixing portion 83 may be provided across the housing portion 86 and the movement-restricting portion 87.

Figure 10:
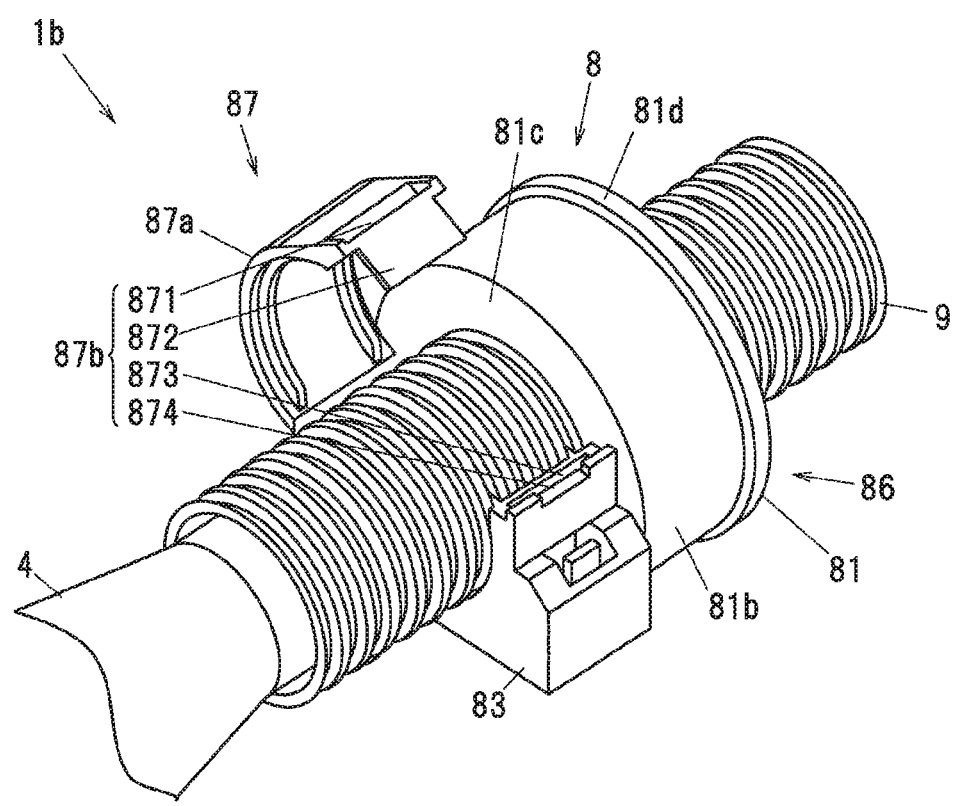
FIG. 10 is an explanatory perspective view showing a fixing means of a movement-restricting portion of the wire harness shown in FIGS. 9A and 9B.

As shown in FIG. 10, the wire harness 1*b* is configured such that the cylindrical portion 87*a* of the movement-restricting portion 87 is cut at an end portion of the fixing portion 83 and is thus openable. The fixing means 87*b* has a tongue portion 872 extending from an end portion of the cylindrical portion 87*a* (an end portion facing the fixing portion 83), a guide hole 873 formed at an end portion of the fixing portion 83 and provided for insertion of the tongue portion 872, a locking protrusion 874 protruding from a rim of the guide hole 873 toward the center of the guide hole 873, and a recessed locking groove 871 formed at the end portion of the cylindrical portion 87*a* (the end portion facing the fixing portion 83) and engaged with the locking protrusion 874.

In the state in which the tongue portion 872 is inserted into the guide hole 873, the tongue portion 872 and the guide hole 873 extend in a direction along a tangent line to a circle centered on the central axis of the cylindrical portion 87*a* (the central axis of the inner wall). The tongue portion 872 and the guide hole 873 serve as a guide when engaging the locking protrusion 874 in the locking groove 871. The relation between protrusion and groove may be reversed, such that the locking groove 871 is formed on the fixing portion 83 side and the locking protrusion 874 on the cylindrical portion 87*a* side (the tongue portion 872 side).

Summary of the Embodiments

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A wire harness (1), comprising: electric wires (2); and an electromagnetic wave suppression member (8) that comprises a restricting member (81) and an annular magnetic core (82), the restricting member (81) being provided to cover the periphery of the electric wires (2) and comprising an inner wall portion (81a) more rigid than the electric wires (2), and the magnetic core (82) being provided around the inner wall portion (81a), wherein the restricting member (81) comprises fixing portions (83) formed to fix the electromagnetic wave suppression member (8) to a fixing target.

[2] The wire harness (1) defined by [1], wherein the magnetic core (82) comprises a nanocrystalline soft magnetic material.

[3] The wire harness (1) defined by [1] or [2], wherein the inner wall portion (81a) is configured to hold the electric wires (2).

[4] The wire harness (1) defined by [3], wherein a braided shield (4) is provided around the electric wires (2), and the inner wall portion (81a) is in contact with the braided shield (4) and holds the electric wires (2) via the braided shield (4).

[5] The wire harness (1) defined by any one of the [1] to [4], wherein the restricting member (81) comprises a cylindrical outer wall portion (81b) and a restricting portion (81c, 81d), the outer wall portion (81b) covering the inner wall portion (81a) and the magnetic core (82) such that the magnetic core (82) is sandwiched between the inner wall portion (81a) and the outer wall portion (81b), and the restricting portion (81c, 81d) preventing the magnetic core (82) from falling through between the inner wall portion (81a) and the outer wall portion (81b).

[6] The wire harness (1) defined by any one of [1] to [5], wherein the magnetic core (82) is formed to cover all of the plurality of electric wires (2).

[7] The wire harness (1a, 1b) defined by any one of [1] to [6], wherein the restricting member (81) integrally comprises a housing portion (86) for housing the magnetic core (82) and a movement-restricting portion (87) fixed to the electric wires (2) or to a member covering the electric wires (2), and the housing portion (86) and the movement-restricting portion (87) are aligned along a longitudinal direction of the electric wires (2).

Although the embodiment of the invention has been described, the invention according to claims is not to be limited to the embodiment described above. Further, please note that all combinations of the features described in the embodiment are not necessary to solve the problem of the invention.

The invention can be appropriately modified and implemented without departing from the gist thereof.

For example, although three electric wires 2 are provided in the embodiment, the number of the electric wires 2 is not limited and may be, e.g., one, two, or not less than four.

What is claimed is:

1. A wire harness, comprising:
an electric wire;
a wire holding member which grips and holds the electric wire inserted therethrough;
an inner wall portion provided to cover a periphery of the electric wire; and
a magnetic core provided around the inner wall portion, wherein the inner wall portion and the magnetic core are spaced apart from the wire holding member in a longitudinal direction of the electric wire.

2. The wire harness according to claim 1, wherein the magnetic core comprises a nanocrystalline soft magnetic material.

3. The wire harness according to claim 1, wherein the inner wall portion is configured to hold the electric wire.

4. The wire harness according to claim 3, wherein a braided shield is provided around the electric wire, and the inner wall portion is in contact with the braided shield and holds the electric wire via the braided shield.

5. The wire harness according to claim 1, further comprising: a restricting member comprising the inner wall portion, a cylindrical outer wall portion and a restricting portion, the outer wall portion covering the inner wall portion and the magnetic core such that the magnetic core is sandwiched between the inner and outer wall portions, and the restricting portion preventing the magnetic core from falling through between the inner and outer wall portions.

6. The wire harness according to claim 1, wherein the electric wire comprises a plurality of electric wires and the magnetic core is formed to cover all of the plurality of electric wires.

7. The wire harness according to claim 5, wherein the restricting member integrally comprises a housing portion for housing the magnetic core and a movement-restricting portion fixed to the electric wire or to a member covering the electric wire, and the housing portion and the movement-restricting portion are aligned along the longitudinal direction of the electric wire.

8. The wire harness according to claim 2, wherein the inner wall portion is configured to hold the electric wire.

9. The wire harness according to claim 2, further comprising: a restricting member comprising the inner wall portion, a cylindrical outer wall portion and a restricting portion, the outer wall portion covering the inner wall portion and the magnetic core such that the magnetic core is sandwiched between the inner and outer wall portions, and the restricting portion preventing the magnetic core from falling through between the inner and outer wall portions.

10. The wire harness according to claim 3, further comprising: a restricting member comprising the inner wall portion, a cylindrical outer wall portion and a restricting portion, the outer wall portion covering the inner wall portion and the magnetic core such that the magnetic core is sandwiched between the inner and outer wall portions, and the restricting portion preventing the magnetic core from falling through between the inner and outer wall portions.

11. The wire harness according to claim 4, further comprising: a restricting member comprising the inner wall portion, a cylindrical outer wall portion and a restricting portion, the outer wall portion covering the inner wall portion and the magnetic core such that the magnetic core is sandwiched between the inner and outer wall portions, and the restricting portion preventing the magnetic core from falling through between the inner and outer wall portions.

12. The wire harness according to claim 2, wherein the electric wire comprises a plurality of electric wires and the magnetic core is formed to cover all of the plurality of electric wires.

13. The wire harness according to claim 3, wherein the electric wire comprises a plurality of electric wires and the magnetic core is formed to cover all of the plurality of electric wires.

14. The wire harness according to claim 4, wherein the electric wire comprises a plurality of electric wires and the magnetic core is formed to cover all of the plurality of electric wires.

15. The wire harness according to claim 5, wherein the electric wire comprises a plurality of electric wires and the magnetic core is formed to cover all of the plurality of electric wires.

16. The wire harness according to claim 9, wherein the restricting member integrally comprises a housing portion for housing the magnetic core and a movement-restricting portion fixed to the electric wire or to a member covering the electric wire, and the housing portion and the movement-restricting portion are aligned along the longitudinal direction of the electric wire.

17. The wire harness according to claim 10, wherein the restricting member integrally comprises a housing portion for housing the magnetic core and a movement-restricting portion fixed to the electric wire or to a member covering the electric wire, and the housing portion and the movement-restricting portion are aligned along the longitudinal direction of the electric wire.

18. The wire harness according to claim 11, wherein the restricting member integrally comprises a housing portion for housing the magnetic core and a movement-restricting portion fixed to the electric wire or to a member covering the electric wire, and the housing portion and the movement-restricting portion are aligned along a longitudinal direction of the electric wire.

19. The wire harness according to claim 1, wherein the inner wall portion is provided to prevent contact of the electric wire with the magnetic core, thereby suppressing application of a load from the electric wire to the magnetic core when the electric wire is bent.

20. The wire harness according to claim 2, wherein the inner wall portion is provided to prevent contact of the electric wire with the magnetic core, thereby suppressing application of a load from the electric wire to the magnetic core when the electric wire is bent.

21. A wire harness, comprising:
an electric wire;
an inner wall portion provided to cover a periphery of the electric wire;
a magnetic core provided around the inner wall portion, and
a restricting member comprising the inner wall portion, a cylindrical outer wall portion and a restricting portion, the outer wall portion covering the inner wall portion and the magnetic core such that the magnetic core is sandwiched between the inner and outer wall portions, and the restricting portion preventing the magnetic core from falling through between the inner and outer portions.

* * * * *